US008073034B2

(12) United States Patent
Chirovsky et al.

(10) Patent No.: US 8,073,034 B2
(45) Date of Patent: Dec. 6, 2011

(54) MESA VERTICAL-CAVITY SURFACE-EMITTING LASER

(75) Inventors: Leo M. F. Chirovsky, Bridgewater, NJ (US); Ramana M. V. Murty, Sunnyvale, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 455 days.

(21) Appl. No.: 12/129,839

(22) Filed: May 30, 2008

(65) Prior Publication Data
US 2008/0298416 A1    Dec. 4, 2008

Related U.S. Application Data

(60) Provisional application No. 60/941,364, filed on Jun. 1, 2007.

(51) Int. Cl.
*H01S 5/00* (2006.01)
(52) U.S. Cl. ............ 372/50.124; 372/43.01; 372/50.11
(58) Field of Classification Search .............. 372/50.11, 372/43.01, 50.124
See application file for complete search history.

(56) References Cited

U.S. PATENT DOCUMENTS

| 5,034,958 | A  | * | 7/1991  | Kwon et al.     | 372/45.01 |
|-----------|----|---|---------|-----------------|-----------|
| 5,245,622 | A  | * | 9/1993  | Jewell et al.   | 372/45.01 |
| 5,577,064 | A  |   | 11/1996 | Swirhun et al.  | 372/96    |
| 6,160,834 | A  |   | 12/2000 | Scott           | 372/96    |
| 6,362,069 | B1 |   | 3/2002  | Forrest et al.  | 438/401   |
| 6,549,556 | B1 | * | 4/2003  | Hwang et al.    | 372/96    |
| 6,570,898 | B2 | * | 5/2003  | Bour et al.     | 372/46.01 |
| 6,611,543 | B2 |   | 8/2003  | Hwang           | 372/50.11 |
| 6,882,673 | B1 | * | 4/2005  | Wasserbauer et al. | 372/50.1 |
| 6,885,690 | B2 |   | 4/2005  | Aggerstam et al.   | 372/96   |
| 6,898,215 | B2 |   | 5/2005  | Naone et al.    | 429/39    |
| 7,075,962 | B2 |   | 7/2006  | Ryou et al.     | 372/46.011 |
| 7,095,768 | B2 |   | 8/2006  | Jiang et al.    | 372/45.01 |
| 7,339,969 | B2 * | | 3/2008  | Chirovsky       | 372/50.124 |
| 7,352,788 | B2 * | | 4/2008  | Corzine et al.  | 372/46.011 |
| 7,376,164 | B2 * | | 5/2008  | Takahashi       | 372/50.1  |
| 7,558,306 | B2 * | | 7/2009  | Watanabe et al. | 372/45.01 |
| 2002/0024980 | A1 * | | 2/2002 | Kwon et al.    | 372/45    |
| 2003/0091083 | A1 * | | 5/2003 | Hwang et al.   | 372/46    |
| 2005/0111507 | A1 * | | 5/2005 | Ueki et al.    | 372/50    |
| 2005/0265412 | A1 * | | 12/2005 | Ueki          | 372/43.01 |
| 2006/0039429 | A1 * | | 2/2006 | Choi et al.    | 372/43.01 |
| 2006/0227835 | A1 * | | 10/2006 | Ueki et al.   | 372/50.124 |
| 2007/0081569 | A1 * | | 4/2007 | Kwon et al.    | 372/43.01 |
| 2008/0151955 | A1 * | | 6/2008 | Behfar et al.  | 372/43.01 |

* cited by examiner

*Primary Examiner* — Jessica Stultz
*Assistant Examiner* — Delma R Forde
(74) *Attorney, Agent, or Firm* — Matthew A. Pequignot; Pequignot + Myers LLC

(57) ABSTRACT

The present invention provides an improved mesa vertical-cavity surface-emitting laser (VCSEL), in which a first distributed Bragg reflector (DBR) mesa of semiconductor material is disposed on a top surface of an active layer. A contact annulus is disposed on a contact region of a top surface of the first DBR mesa, such that an inner circumference of the contact annulus defines a window region of the top surface of the first DBR mesa. A second DBR mesa of dielectric material is disposed on the window region. Whereas the first DBR mesa has a first reflectance at a lasing wavelength that is insufficient to sustain lasing in the active layer, the first DBR mesa and the second DBR mesa together have a total reflectance at the lasing wavelength that is sufficient to sustain lasing in the active layer under the window region.

19 Claims, 5 Drawing Sheets

US 8,073,034 B2

MESA VERTICAL-CAVITY SURFACE-EMITTING LASER

CROSS-REFERENCE TO RELATED APPLICATIONS

The present invention claims priority from U.S. Patent Application No. 60/941,364 filed Jun. 1, 2007, which is incorporated herein by reference.

TECHNICAL FIELD OF THE INVENTION

The present invention relates to vertical-cavity surface-emitting lasers (VCSELs) and, in particular, to mesa VCSELs.

BACKGROUND OF THE INVENTION

VCSELs are commonly used as light sources in optical transceivers for local area networks (LANs) and storage area networks (SANs). Oxide-apertured VCSELs are currently the dominant technology for such applications. However, a mesa VCSEL was recently developed that includes a mesa, rather than an oxide aperture, for current confinement, as disclosed in U.S. Pat. No. 7,095,768, issued on Aug. 22, 2006 to Jiang, et al., which is owned by the assignee of the present invention and is incorporated herein by reference. Advantageously, the mesa VCSEL is both more reliable and more easily manufactured than oxide-apertured VCSELs. Unfortunately, the mesa VCSEL has the disadvantage of a somewhat higher level of relative-intensity noise (RIN) in relation to oxide-apertured VCSELs. At data rates above 4 Gbit/s, the RIN of the mesa VCSEL can reach an unacceptable level.

With reference to FIG. 1, such a prior-art mesa VCSEL 100 includes a contact layer 110 of metallic material, a substrate 120 of semiconductor material, a distributed Bragg reflector (DBR) layer 130 of semiconductor material, an active layer 140 of semiconductor material, a DBR mesa 150 of semiconductor material, a planarization layer 160 of dielectric material, and a contact annulus 170 of metallic material. In particular, the active layer 140 is disposed on a top surface of the DBR layer 130, and the DBR mesa 150 is disposed on a mesa region 141 of a top surface of the active layer 140. The contact annulus 170 is disposed on a contact region 151 of a top surface of the DBR mesa 150, such that an inner circumference of the contact annulus 170 defines a window region 152 of the top surface of the DBR mesa 150.

According to experiments, the level of RIN of the mesa VCSEL 100 increases as the inner circumference of the contact annulus 170 decreases, for a constant outer circumference of the contact annulus 170. Thus, the somewhat higher level of RIN of the mesa VCSEL 100 may be a result of lasing sustained in the active layer 140 under the contact annulus 170. As indicated by arrows in FIG. 1, light resonates in the active layer 140 under the DBR mesa 150, but is only emitted from the window region 152 of the top surface of the DBR mesa 150. As the mesa VCSEL 100 lases in several transverse modes which have different fractions of their optical power under the contact annulus 170, the optical power emitted from the mesa VCSEL 100 varies slightly, but randomly, over time, owing to competition between the transverse modes.

An object of the present invention is to overcome the shortcomings of the prior-art mesa VCSEL 100 by providing an improved mesa VCSEL, in which lasing is sustained in the active layer mainly under the window region.

SUMMARY OF THE INVENTION

Accordingly, the present invention relates to a mesa VCSEL comprising: a DBR layer of semiconductor material, for reflecting light at a lasing wavelength; an active layer of semiconductor material, disposed on a top surface of the DBR layer, for lasing at the lasing wavelength; a first DBR mesa of semiconductor material, disposed on a mesa region of a top surface of the active layer, for reflecting light at the lasing wavelength; a contact annulus of metallic material, disposed on a contact region of the top surface of the first DBR mesa, for passing current to or from the mesa VCSEL, wherein an inner circumference of the contact annulus defines a window region of the top surface of the first DBR mesa; and a second DBR mesa of dielectric material, disposed on the window region of the top surface of the first DBR mesa, for reflecting light at the lasing wavelength; wherein the first DBR mesa has a first reflectance at the lasing wavelength that is insufficient to sustain lasing in the active layer, and wherein the first DBR mesa and the second DBR mesa together have a total reflectance at the lasing wavelength that is sufficient to sustain lasing in the active layer under the window region.

BRIEF DESCRIPTION OF THE DRAWINGS

The present invention will be described in greater detail with reference to the accompanying drawings, wherein.

DETAILED DESCRIPTION OF THE INVENTION

The present invention provides an improved mesa VCSEL. The improvements afforded by the present invention will be described herein in the context of exemplary embodiments of a mesa VCSEL. However, those skilled in the art will appreciate that the improvements could also be applied to mesa VCSELs having other structures.

Figure 1:
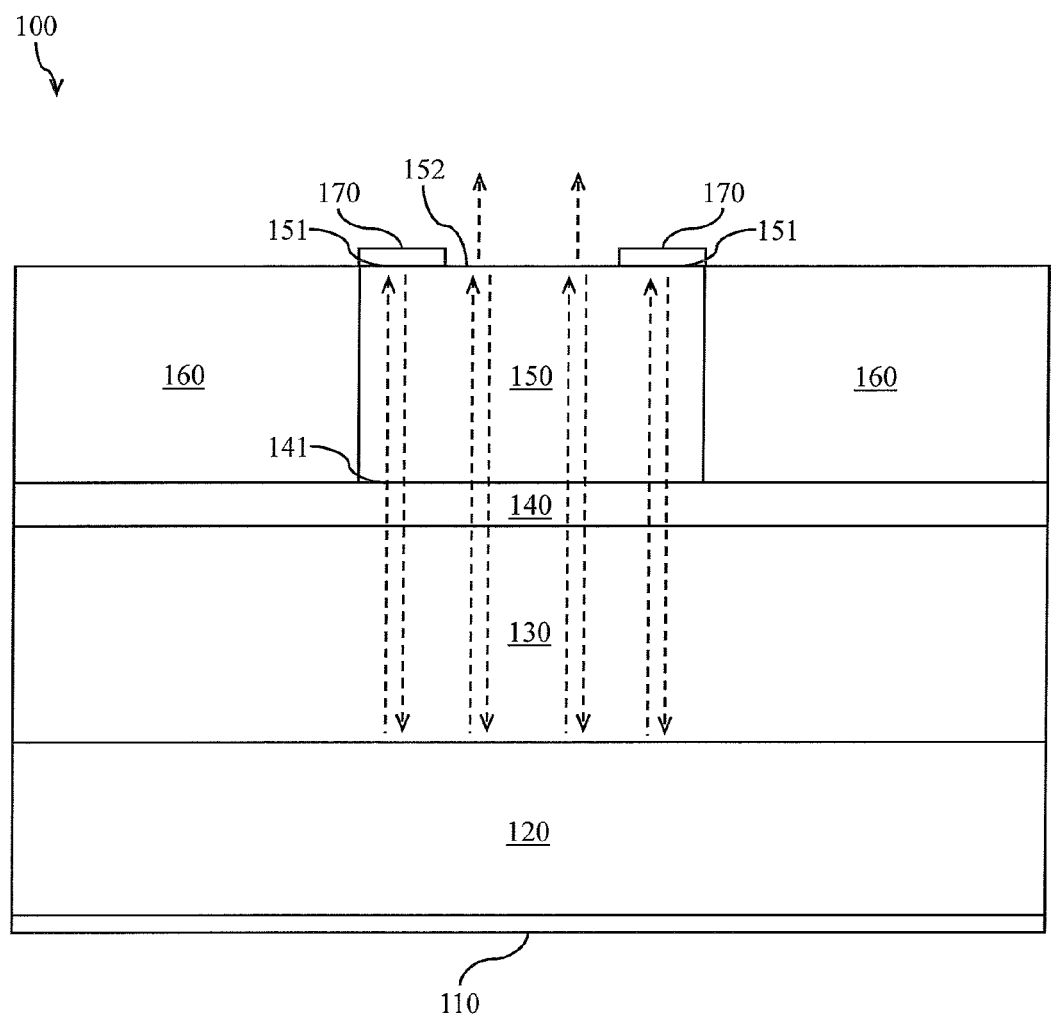
FIG. 1 is a schematic illustration of a cross-section of a prior-art mesa VCSEL.
Figure 2:
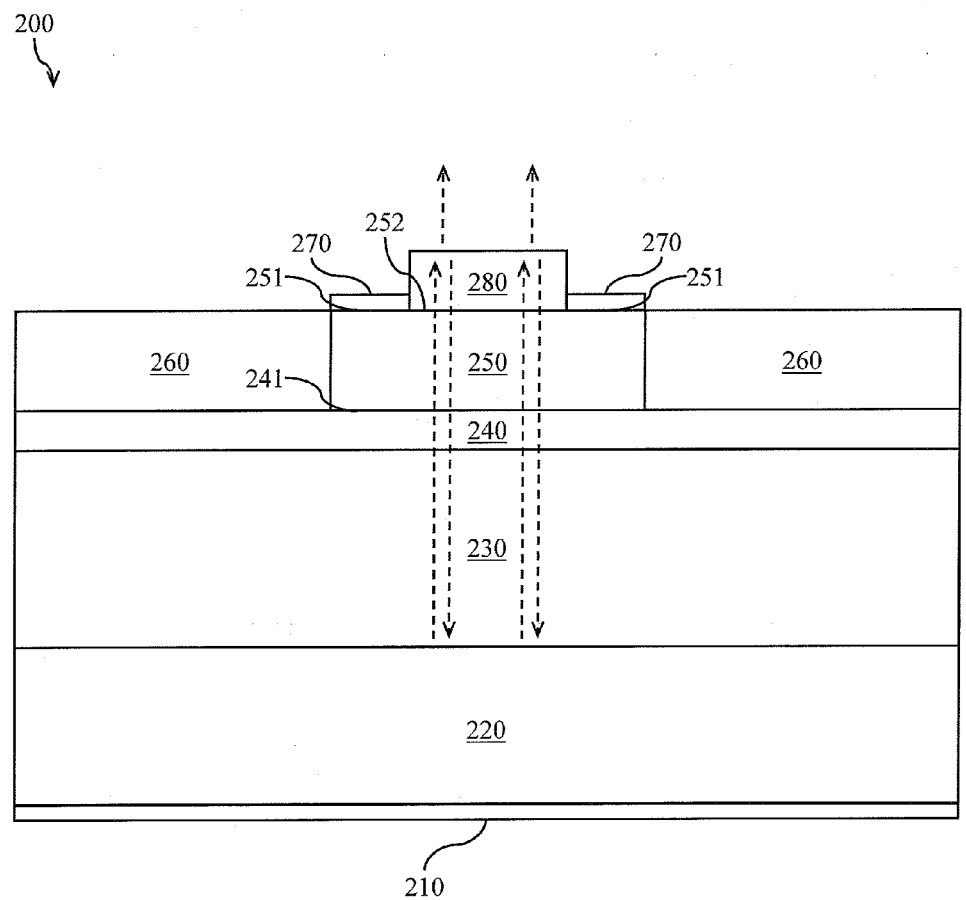
FIG. 2 is a schematic illustration of a cross-section of a mesa VCSEL according to a first exemplary embodiment of the present invention.
Figure 3:
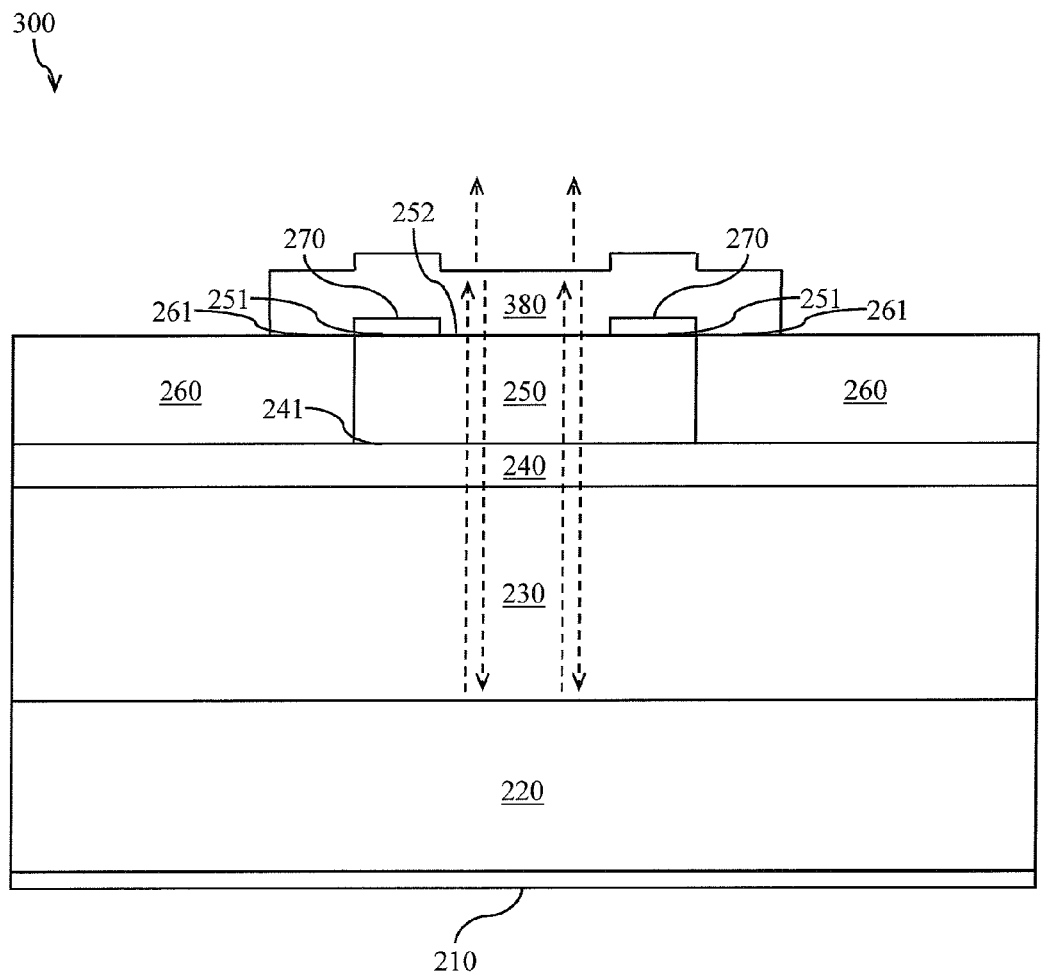
FIG. 3 is a schematic illustration of a cross-section of a mesa VCSEL according to a second exemplary embodiment of the present invention.

With reference to FIGS. 2 and 3, mesa VCSELs 200 and 300, according to exemplary embodiments of the present invention, have structures based in part on that of the prior-art mesa VCSEL 100 illustrated in FIG. 1. The mesa VCSELs 200 and 300 each include a contact layer 210 of metallic material, a substrate 220 of semiconductor material, a DBR layer 230 of semiconductor material, an active layer 240 of semiconductor material, a first DBR mesa 250 of semiconductor material, a planarization layer 260 of dielectric material, and a contact annulus 270 of metallic material, in an arrangement similar to that in the prior-art mesa VCSEL 100.

The contact layer 210 is disposed on a bottom surface of the substrate 220, and the DBR layer 230 is disposed on a top surface of the substrate 220. The active layer 240 is disposed on a top surface of the DBR layer 230, and the first DBR mesa 250 is disposed on a mesa region 241 of a top surface of the active layer 240. Preferably, the first DBR mesa 250 is cylindrical, and the mesa region 241 is circular. The planarization layer 260 is disposed on the top surface of the active layer 240 with exception of the mesa region 241, such that a top surface of the planarization layer 260 and the top surface of the first DBR mesa 250 together form an essentially planar surface. The contact annulus 270 is disposed on an annular contact region 251 of a top surface of the first DBR mesa 250, such that an inner circumference of the contact annulus 270 defines a circular window region 252 of the top surface of the first DBR mesa 250.

In addition, the mesa-VCSEL 200 includes a second DBR mesa 280 of dielectric material, which is disposed only on the window region 252 of the top surface of the first DBR mesa 250. Similarly, the mesa VCSEL 300 includes a second DBR mesa 380 of dielectric material, which is disposed on a top surface of the contact annulus 270, as well as on the window region 252 of the top surface of the first DBR mesa 250. In some instances, the second DBR mesa 380 is also disposed on a mesa region 261 of the top surface of the planarization layer 260. Preferably, the second DBR mesa 280 or 380 is cylindrical, and the mesa region 261 is annular.

As in the prior-art mesa VCSEL 100, the DBR layer 230 of semiconductor material provides a lower mirror for optical confinement of the active layer 240 in the mesa VCSELs 200 and 300. Unlike the prior-art mesa VCSEL 100, in which the DBR mesa 150 of semiconductor material alone provides an upper mirror for optical confinement of the active layer 140, in the mesa VCSELs 200 and 300, a combination of the first DBR mesa 250 of semiconductor material and the second DBR mesa 280 of dielectric material or a portion of the second DBR mesa 380 of dielectric material disposed over the window region 252 provides an upper mirror for optical confinement of the active layer 240.

The first DBR mesa 250 contributes a first reflectance to a total reflectance of the upper mirror at a lasing wavelength of the mesa VCSELs 200 and 300. The first reflectance of the first mesa DBR 250, which is reduced in relation to that of the DBR mesa 150 in the prior-art mesa VCSEL 100, is insufficient to sustain lasing in the active layer 240. The second DBR mesa 280 or the portion of the second DBR mesa 380 disposed over the window region 252 contributes a second reflectance to the total reflectance to ensure that the total reflectance of the upper mirror is sufficient to sustain lasing in the active layer 240 under the window region 252. In other words, the total reflectance of the upper mirror is sufficient for stimulated emission to dominate over spontaneous emission in the active layer 240 under the window region 252, even at a maximum bias current specified for the mesa VCSELs 200 and 300. In the mesa VCSEL 300, the contact annulus 270 blocks transmission of light to a portion of the second DBR mesa 380 disposed over the contact region 251, thus, inhibiting lasing in the active layer 240 under the contact region 251. As indicated by arrows in FIGS. 2 and 3, light resonates mainly under the second DBR mesa 280 or the portion of the second DBR mesa 380 disposed over the window region 252 and is emitted from the second DBR mesa 280 or the portion of the second DBR mesa 380 disposed over the window region 252. Thus, for reasons mentioned heretofore, the improvements provided by the present invention may be advantageous in reducing the level of RIN of the mesa VCSELs 200 and 300.

Furthermore, the first DBR mesa 250 of semiconductor material conducts and confines current passed to or from the mesa VCSELs 200 and 300 via the contact annulus 270, but the second DBR mesa 280 or 380 of dielectric material does not conduct current to an appreciable extent. Thus, advantageously, an electrical resistance of the first DBR mesa 250 in the mesa VCSELs 200 and 300 may be reduced relative to that of the DBR mesa 150 in the prior-art mesa VCSEL 100.

The structures of the improved mesa VCSELs 200 and 300 will be described in further detail in the following.

The contact layer 210, for passing current from or to the mesa VCSELs 200 and 300, is of metallic material suitable for ohmic contacting. In a preferred embodiment, the contact layer 210 is of eutectic gold-germanium alloy.

The substrate 220 is, typically, of extrinsic semiconductor material of a first conductivity type, i.e. n-type or p-type. Preferably, the substrate 220 is of an n-type or p-type III-V semiconductor compound. An n-type III-V semiconductor compound, typically, includes a donor dopant of Group VI, such as sulfur, selenium, or tellurium, or of Group IV, such as carbon, silicon, or germanium. A p-type III-V semiconductor compound, typically, includes an acceptor dopant of Group II, such as beryllium, zinc, or cadmium, or of Group IV, such as carbon, silicon, or germanium. In a preferred embodiment, the substrate 220 is of n-type GaAs.

In some instances, the substrate 220 includes a buffer layer, disposed at a top surface of the substrate 220, for accommodating lattice mismatch between the substrate 220 and the DBR layer 230. The buffer layer is, typically, of the same semiconductor material as the substrate 220. In a preferred embodiment, the buffer layer is of n-type GaAs.

The DBR layer 230, for reflecting light at the lasing wavelength, is also, typically, of extrinsic semiconductor material of the first conductivity type. Preferably, the DBR layer 230 is of at least two n-type or p-type III-V semiconductor compounds. The DBR layer 230 includes a plurality of layer pairs, each of which comprises two layers of different compositions and, hence, different refractive indices n. The plurality of layer pairs are disposed such that layers of different compositions alternate. In some instances, grading layers are disposed between layers of different compositions. Preferably, the two layers of each layer pair have thicknesses corresponding to optical path lengths of approximately one quarter of the lasing wavelength. In a preferred embodiment, the DBR layer 230 includes a plurality of layer pairs each comprising two layers of n-type $Al_{1-x}Ga_xAs$ ($0 \leq x \leq 1$), hereafter referred to as AlGaAs, of different compositions, i.e. with different values of x. For example, the DBR layer 230 may include 35 layer pairs each comprising one layer of n-type AlGaAs with x=0.90 (n=3.04 at 850 μm) and one layer of n-type AlGaAs with x=0.15 (n=3.51 at 850 nm).

The number of layer pairs in the DBR layer 230, and the compositions and thicknesses of the two layers of each layer pair in the DBR layer 230 are selected to provide the DBR layer 230 with a reflectance at the lasing wavelength that is sufficient to sustain lasing in the active layer 240. Typically, the reflectance of the DBR layer 230 is greater than or equal to 99.9% at the lasing wavelength. Preferably, the reflectance of the DBR layer 230 is greater than or equal to 99.98% at the lasing wavelength. The DBR layer 230, typically, includes at least 30 layer pairs.

The active layer 240, for lasing at the lasing wavelength, preferably, includes one or more quantum structures, such as quantum wells, quantum wires, or quantum dots, as well as one or more barrier structures, disposed between the one or more quantum structures. The one or more quantum structures and the one or more barrier structures are, typically, of intrinsic, i.e. not intentionally doped, semiconductor material. Preferably, the one or more quantum structures and the one or more barrier structures are of at least two III-V semiconductor compounds. The semiconductor material of the one or more quantum structures is selected to have a band-gap energy $E_g$ corresponding to the desired lasing wavelength. The semiconductor material of the one or more barrier structures is selected to have a larger band-gap energy. In a preferred embodiment, with a lasing wavelength near 850 nm, the active layer 240 includes quantum-well layers of GaAs separated by barrier layers of AlGaAs. For example, the active layer 240 may include three quantum-well layers of GaAs ($E_g$=1.43 eV) and four barrier layers of AlGaAs with x=0.35 ($E_g$=1.86 eV).

In some instances, the active layer 240 also includes a first cladding layer, disposed at a bottom surface of the active layer 240, and a second cladding layer, disposed at a top surface of the active layer 240, for improving the optical confinement of the active layer 240. The first cladding layer is, typically, of extrinsic semiconductor material of the first conductivity type, and the second cladding layer is, typically, of extrinsic semiconductor material of the second conductivity type. Preferably, the first cladding layer is of an n-type or p-type III-V semiconductor compound, and the second cladding layer is of a p-type or n-type III-V semiconductor compound. The semiconductor materials of the first and second cladding layers are selected to have refractive indices lower than those of the one or more quantum structures and the one or more barrier structures. In a preferred embodiment, the active layer 240 includes a first cladding layer of n-type AlGaAs and a second cladding layer of p-type AlGaAs. For example, when the active layer 240 includes quantum-well layers of GaAs (n=3.64 at 850 nm) and barrier layers of AlGaAs with x=0.35 (n=3.37 at 850 nm), it may also include first and second cladding layers of n-type and p-type AlGaAs with x=0.60 (n=3.21 at 850 nm), respectively.

The first DBR mesa 250, for reflecting light at the lasing wavelength, is, typically, of extrinsic semiconductor material of the second conductivity type. Preferably, the first DBR mesa 250 is of at least two p-type or n-type III-V semiconductor compounds. The first DBR mesa 250 includes a plurality of layer pairs, each of which comprises two layers of different compositions and, hence, different refractive indices. The layer pairs are disposed such that layers of different compositions alternate. In some instances, grading layers, which may have modulated doping levels, are disposed between layers of different compositions. Preferably, the two layers of each layer pair have thicknesses corresponding to optical path lengths of approximately one quarter of the lasing wavelength. In a preferred embodiment, the first DBR mesa 250 includes a plurality of layer pairs each comprising two layers of p-type AlGaAs of different compositions. For example, the first DBR mesa 250 may include 11 layer pairs each comprising one layer of p-type AlGaAs with x=0.90 (n=3.04 at 850 nm) and one layer of p-type AlGaAs with x=0.15 (n=3.51 at 850 nm), as well as 7 layer pairs each comprising one layer of p-type AlGaAs with x=0.80 (n=3.10 at 850 nm) and one layer of p-type AlGaAs with x=0.15 (n=3.51 at 850 nm).

The number of layer pairs in the first DBR mesa 250, and the compositions and thicknesses of the two layers of each layer pair in the first DBR mesa 250 are selected to provide the first DBR mesa 250 with a first reflectance at the lasing wavelength that is insufficient to sustain lasing in the active layer 240. Typically, the first reflectance of the first DBR mesa 250 is less than or equal to 98% at the lasing wavelength. Preferably, the first reflectance of the first DBR mesa 250 is less than or equal to 90% at the lasing wavelength. More preferably, the first reflectance of the first DBR mesa 250 is less than or equal to 70% at the lasing wavelength. The first DBR mesa 250, typically, includes at most 20 layer pairs.

In some instances, the active layer 240 includes a first implant region, disposed at the top surface of the active layer 240 with exception of the mesa region 241, and the first DBR mesa 250 includes a second implant region, disposed at a side surface of the first DBR mesa 250, for inhibiting surface currents. The first and second implant regions are implanted with ions, such as $H^+$ or $B^+$.

The planarization layer 260, for planarizing the first DBR mesa 250, supports metal leads and pads for passing current to or from the contact annulus 270. The planarization layer 260 is, preferably, of a low-k dielectric material to reduce the capacitance of the VCSELs 200 and 300. In a preferred embodiment, the planarization layer 260 is of benzocyclobutene (BCB). Alternatively, the planarization layer 260 may be of a polyimide.

The contact annulus 270, for passing current to or from the mesa VCSELs 200 and 300, is of a metallic material suitable for ohmic contacting. Preferably, the contact annulus 270 is opaque, i.e. non-transmittive, and poorly reflective at the lasing wavelength to inhibit lasing in the active layer 240 under the contact annulus 270. It is particularly important for the contact annulus 270 to be non-transmittive in the mesa VCSEL 300, as the second DBR mesa 380 is disposed on the top surface of the contact annulus 270. Preferably, the contact annulus 270 has a reflectance of less than 50% at the lasing wavelength. More preferably, the contact annulus 270 has a reflectance of less than 30% at the lasing wavelength. In a preferred embodiment, the contact annulus 270 includes a layer of titanium, a layer of platinum, and a layer of gold. Alternatively, the contact annulus 270 may be of gold with 2% beryllium added.

The second DBR mesa 280 or 380, for reflecting light at the lasing wavelength, is, typically, of at least two dielectric compounds. The second DBR mesa 280 or 380 includes a plurality of layer pairs, each of which comprises two layers of different compositions and, hence, different refractive indices. The plurality of layer pairs are disposed such that layers of different compositions alternate. Preferably, the two layers of each layer pair have thicknesses corresponding to optical path lengths of approximately one quarter of the lasing wavelength. In a preferred embodiment, the second DBR mesa 280 or 380 includes a plurality of layer pairs each comprising one layer of $SiO_2$ (n=1.46 at 850 nm) and one layer of $SiN_x$ (n=2.05 at 850 nm). For example, the second DBR mesa 280 or 380 may comprise four such layer pairs. Alternatively, the second DBR mesa 280 or 380 may include a plurality of layer pairs each comprising one layer of $MgF_2$ and one layer of ZnS, or each comprising one layer of $SiO_2$ and one layer of $TiO_2$.

As the aforementioned dielectric materials, as well as others familiar to those skilled in the art, all have optical properties suitable for the second DBR mesa 280 or 380, mechanical properties of the dielectric materials, relating to conformal deposition, adhesion, and ease of patterning, for example, may determine the optimum dielectric materials for a given embodiment of the present invention.

The number of layer pairs in the second DBR mesa 280 or 380, and the compositions and thicknesses of the two layers of each layer pair in the second DBR mesa 280 or 380 are selected to provide the second DBR mesa 280 or 380 with a second reflectance at the lasing wavelength. The second reflectance $R_2$ of the second DBR mesa 280 or 380 is chosen in conjunction with the first reflectance $R_1$ of the first DBR mesa 250, such that a total reflectance $R_t$ at the lasing wavelength, of the first DBR mesa 250 and the second DBR mesa 280 or the portion of the second DBR mesa 380 disposed over the window region 252, which is given by:

$$R_t = \frac{(R_1^{1/2} + R_2^{1/2})^2}{(1 + R_1^{1/2} R_2^{1/2})^2}, \qquad (1)$$

is sufficient to sustain lasing in the active layer 240 under the window region 252, preferably, at a desired slope efficiency. Typically, the total reflectance is greater than or equal to 99% at the lasing wavelength. Preferably, the total reflectance is greater than or equal to 99.5% at the lasing wavelength. The second DBR mesa 280 or 380, typically, includes at least two layer pairs.

Together, the upper limit on the first reflectance and the lower limit on the total reflectance ensure that lasing is sustained in the active layer 240 mainly under the window region 252. Preferably, lasing is sustained in the active layer 240 only under the window region 252.

Ideally, the number of layer pairs in the first DBR mesa 250 is minimized to minimize the first reflectance, and the number of layer pairs in the second DBR mesa 280 or 380 is maximized to maximize the total reflectance.

A factor to be considered in determining the maximum number of layer pairs in the second DBR mesa 280 or 380 is that the second DBR mesa 280 or 380 must be substantially conformal, i.e. have a substantially uniform thickness over its entirety. The second DBR mesa 280 is, preferably, conformally disposed on the window region 252 of the top surface of the first DBR mesa 250. Likewise, the second DBR mesa 380 is, preferably, conformally disposed on the window region 252 of the top surface of the first DBR mesa 250, on the top surface of the contact annulus 270, and, in some instances, on the mesa region 261 of the top surface of the planarization layer 260. However, with increasing number of layer pairs, conformal deposition becomes more difficult. Thus, the maximum number of layer pairs that allows the formation of the second DBR mesa 280 or 380 via conformal deposition is, preferably, selected.

Figure 4:
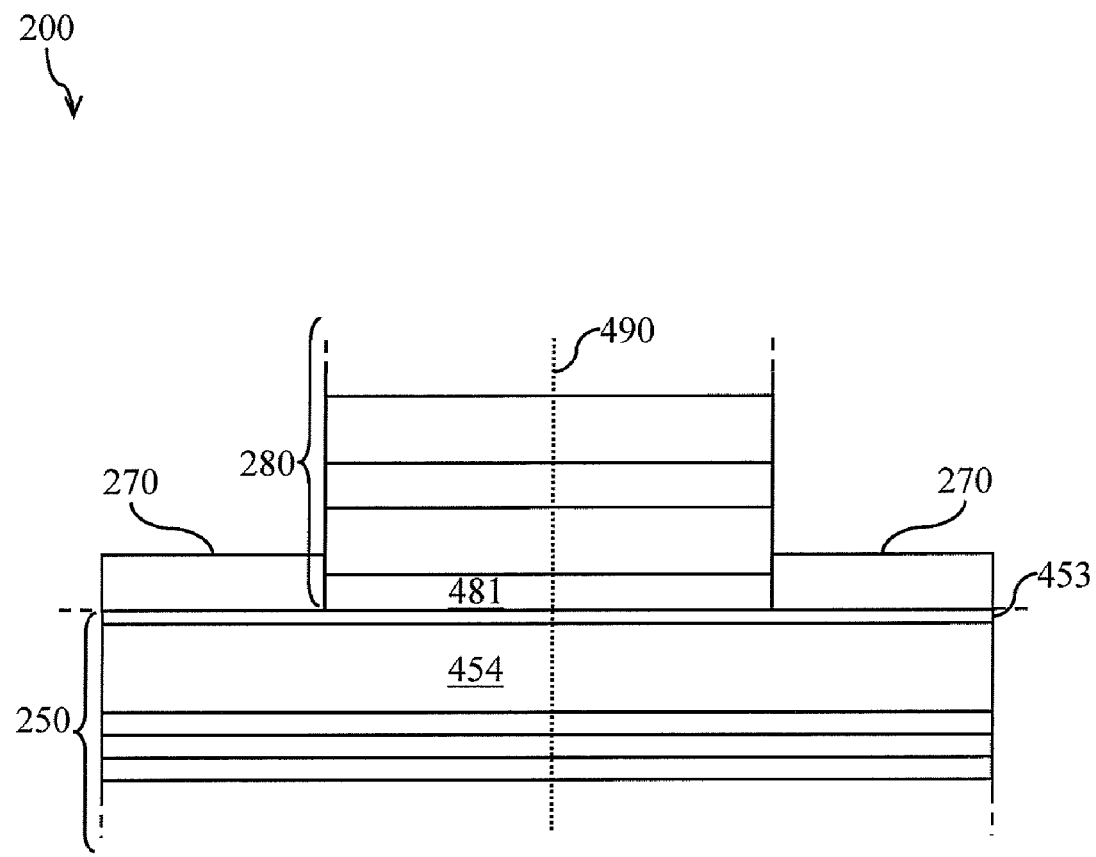
FIG. 4 is a schematic illustration of a cross-section of part of an upper mirror in the mesa VCSEL of FIG. 2.
Figure 5:
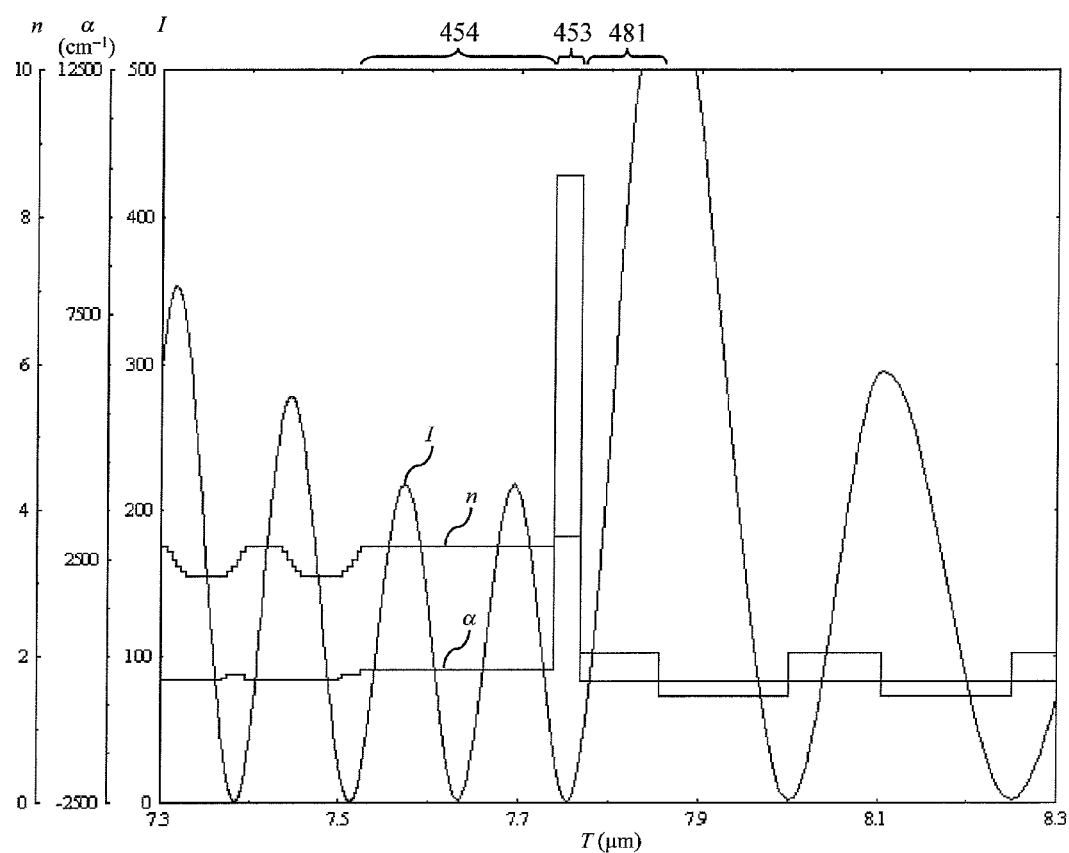
FIG. 5 is a plot of refractive index, optical absorptivity, and standing-wave intensity at 850 nm as a function of distance from the substrate along a vertical axis through the cross-section of FIG. 4.

With reference to FIGS. 4 and 5, the first DBR mesa 250, typically, includes a capping layer 453, disposed at a top surface of the first DBR mesa 250, for facilitating ohmic contacting with the contact annulus 270. Preferably, the capping layer 453 is of a heavily doped p-type or n-type III-V semiconductor compound. In a preferred embodiment, the capping layer 453 is of p-type GaAs.

In determining the minimum number of layer pairs in the first DBR mesa 250, optical absorption by the capping layer 453 at the lasing wavelength must be considered. With decreasing number of layer pairs in the first DBR mesa 250, optical absorption by the capping layer 453 at the lasing wavelength increases, because of increasing intensity of a standing wave of light resonating under the second DBR mesa 280 or under the portion of the second DBR mesa 380 disposed over the window region 252. Thus, the minimum number of layer pairs that provides the first DBR mesa 250 with an acceptable optical absorptance is, preferably, selected. The optical absorptance of the first DBR mesa 250 must be low enough to allow lasing to be sustained in the active layer 240 under the window region 252, preferably, at a desired slope efficiency.

To minimize the optical absorptance of the first DBR mesa 250 at the lasing wavelength, the capping layer 453 of the first DBR mesa 250 must be as thin as practical for ohmic contacting. Preferably, the first DBR mesa 250 also includes a first spacer layer 454, and the second DBR mesa 280 or 380 includes a second spacer layer 481, for mitigating optical absorption by the capping layer 453 at the lasing wavelength.

The capping layer 453 is disposed on a top surface of the first spacer layer 454, and the second spacer layer 481 is disposed at a bottom surface of the second DBR mesa 280 or 380 on a top surface of the capping layer 453. Preferably, the first spacer layer 454 has a same composition as one of the layers of a layer pair in the first DBR mesa 250. Likewise, the second spacer layer 481, preferably, has a same composition as one of the layers of a layer pair in the second DBR mesa 280 or 380. In a preferred embodiment, the first spacer layer 454 is of p-type AlGaAs, and the second spacer layer 481 is of $SiN_x$. For example, the first spacer layer 454 may be of p-type AlGaAs with x=0.15.

The first spacer layer 454 has a first thickness, the capping layer 453 has a second thickness, and the second spacer layer 481 has a third thickness. The first, second, and third thicknesses are selected to position the capping layer 453 near a null in the standing wave of light resonating under the second DBR mesa 280 or under the portion of the second DBR mesa 380 disposed over the window region 252. The first, second, and third thicknesses are also chosen to ensure that the first DBR mesa 250 and the second DBR mesa 280 or 380 are in phase, such that maxima in the standing wave are positioned near high-to-low refractive-index interfaces, as viewed from the active layer 240, in the first DBR mesa 250 and the second DBR mesa 280 or the portion of the second DBR mesa 380 disposed over the window region 252. In FIG. 5, to demonstrate these properties for mesa VCSEL 200, refractive index n, optical absorptivity α, and standing-wave intensity I at 850 nm are plotted as a function of distance T from the substrate 220 along a vertical axis 490 of FIG. 4.

A method of fabricating the mesa VCSELs 200 and 300, which is based on the method of fabrication of the prior-art VCSEL 100, as disclosed in U.S. Pat. No. 7,095,768 issued on Aug. 22, 2006 to Jiang et al., will be described in brief in the following.

In a first step, the substrate 220 is provided. The DBR layer 230 is epitaxially grown on the top surface of the substrate 220, the active layer 240 is epitaxially grown on the top surface of the DBR layer 230, and a second DBR layer of semiconductor material is epitaxially grown on the top surface of the DBR layer 230. These epitaxial growth steps are, preferably, performed by metal-organic chemical vapor deposition (MOCVD) or by molecular beam epitaxy (MBE).

The second DBR layer then is etched to form the first DBR mesa 250 on the mesa region 241 of the top surface of the active layer 240 and to expose the top surface of the active layer 240 with exception of the mesa region 241. This etching step is, preferably, performed by wet or dry chemical etching, in a photolithography process. At this point, the top surface of the active layer 240 with exception of the mesa region 241 and the side surface of the first DBR mesa 250 may be passivated by a shallow ion implantation to form the first and second implant regions, respectively, while the top surface of the first DBR mesa 250 is carefully protected.

The planarization layer 260 is then deposited on the top surface of the active layer 240 with exception of the mesa region 241, preferably, by spin coating or chemical vapor deposition (CVD). The contact annulus 270 is deposited on the contact region 251 of the top surface of the first DBR mesa 250, and the contact layer 210 is deposited on the bottom surface of the substrate 220. These deposition steps are, preferably, performed by physical vapor deposition (PVD), in a photolithography lift-off process.

To fabricate the mesa VCSEL 200, a third DBR layer of dielectric material is conformally deposited on the window region 252 of the top surface of the first DBR mesa 250, on the top surface of the contact annulus 270, and, in some instances, on the mesa region 261 of the top surface of the planarization layer 260, preferably, by CVD or PVD. The third DBR layer is then etched to form the second DBR mesa 280 on the window region 252 and to expose the top surface of the contact annulus 270. This etching step is, preferably, performed by wet or dry chemical etching, in a photolithography process.

To fabricate the mesa VCSEL 300, the second DBR mesa 380 is conformally deposited on the window region 252, on the top surface of the contact annulus 270, and, in some instances, on the mesa region 261, preferably, by CVD or PVD, in a photolithography lift-off process.

Of course, numerous other embodiments of the present invention may be envisaged without departing from the spirit and scope of the invention.

We claim:

1. A mesa vertical-cavity surface-emitting laser (VCSEL) comprising:
    a distributed Bragg reflector (DBR) layer of semiconductor material, for reflecting light at a lasing wavelength;
    an active layer of semiconductor material, disposed on a top surface of the DBR layer, for lasing at the lasing wavelength;
    a first DBR mesa of semiconductor material, disposed on a mesa region of a top surface of the active layer, for reflecting light at the lasing wavelength;
    a contact annulus of metallic material, disposed on a contact region of the top surface of the first DBR mesa, for passing current to or from the mesa VCSEL, wherein an inner circumference of the contact annulus defines a window region of the top surface of the first DBR mesa; and
    a second DBR mesa of dielectric material, disposed at least on the window region of the top surface of the first DBR mesa, for reflecting light at the lasing wavelength;
    wherein the first DBR mesa has a first reflectance at the lasing wavelength that is insufficient to sustain lasing in the active layer;
    wherein the first DBR mesa and the second DBR mesa together have a total reflectance at the lasing wavelength that is sufficient to sustain lasing in the active layer under the window region;
    wherein the first DBR mesa includes a capping layer, disposed at a top surface of the first DBR mesa, for facilitating ohmic contacting with the contact annulus, and a first spacer layer, for mitigating optical absorption by the capping layer at the lasing wavelength, wherein the capping layer is disposed on a top surface of the first spacer layer; and
    wherein the second DBR mesa includes a second spacer layer, disposed at a bottom surface of the second DBR mesa on a top surface of the capping layer, for mitigating optical absorption by the capping layer at the lasing wavelength.

2. The mesa VCSEL of claim 1 further comprising a substrate of semiconductor material, wherein the DBR layer is disposed on a top surface of the substrate.

3. The mesa VCSEL of claim 2 further comprising a contact layer of metallic material, disposed on a bottom surface of the substrate, for passing current from or to the mesa VCSEL.

4. The mesa VCSEL of claim 1 further comprising a planarization layer of dielectric material, disposed on the top surface of the active layer with exception of the mesa region of the top surface of the active layer, for planarizing the first DBR mesa.

5. The mesa VCSEL of claim 4 wherein the second DBR mesa is disposed on the window region of the top surface of the first DBR mesa, on a top surface of the contact annulus, and on a mesa region of a top surface of the planarization layer, and wherein the first DBR mesa and a portion of the second DBR mesa disposed over the window region together have a total reflectance at the lasing wavelength that is sufficient to sustain lasing in the active layer under the window region.

6. The mesa VCSEL of claim 5 wherein the second DBR mesa is conformally disposed on the window region of the top surface of the first DBR mesa and on the top surface of the contact annulus.

7. The mesa VCSEL of claim 5 wherein the second DBR mesa is conformally disposed on the window region of the top surface of the first DBR mesa, on the top surface of the contact annulus, and on the mesa region of the top surface of the planarization layer.

8. The mesa VCSEL of claim 1 wherein the second DBR mesa is disposed only on the window region of the top surface of the first DBR mesa.

9. The mesa VCSEL of claim 1 wherein the second DBR mesa is disposed on the window region of the top surface of the first DBR mesa and on a top surface of the contact annulus, and wherein the first DBR mesa and a portion of the second DBR mesa disposed over the window region together have a total reflectance at the lasing wavelength that is sufficient to sustain lasing in the active layer under the window region.

10. The mesa VCSEL of claim 1 wherein the second DBR mesa is conformally disposed on the window region of the top surface of the first DBR mesa.

11. The mesa VCSEL of claim 1 wherein the DBR layer, the first DBR mesa, and the second DBR mesa each include a plurality of layer pairs.

12. The mesa VCSEL of claim 11 wherein the DBR layer includes at least 30 layer pairs, the first DBR mesa includes at most 20 layer pairs, and the second DBR mesa includes at least two layer pairs.

13. The mesa VCSEL of claim 1 wherein the active layer includes one or more quantum structures and one or more barrier structures.

14. The mesa VCSEL of claim 1 wherein the active layer includes a first implant region, disposed at the top surface of the active layer with exception of the mesa region of the top surface of the active layer, for inhibiting surface currents, and wherein the first DBR mesa includes a second implant region, disposed at a side surface of the first DBR mesa, for inhibiting surface currents.

15. The mesa VCSEL of claim 1 wherein the contact annulus is opaque and poorly reflective at the lasing wavelength to inhibit lasing in the active layer under the contact annulus.

16. The mesa VCSEL of claim 1 wherein the first reflectance is less than or equal to 98% at the lasing wavelength, and the total reflectance is greater than or equal to 99% at the lasing wavelength.

17. The mesa VCSEL of claim 16 wherein the first reflectance is less than or equal to 90% at the lasing wavelength.

18. The mesa VCSEL of claim 1 wherein lasing is sustained in the active layer only under the window region.

19. The mesa VCSEL of claim 1 wherein a first thickness of the first spacer layer, a second thickness of the capping layer, and a third thickness of the second spacer layer are selected to position the capping layer near a null in a standing wave of light resonating under the second DBR mesa.

* * * * *